(12) United States Patent
Orlowski et al.

(10) Patent No.: US 7,163,903 B2  
(45) Date of Patent: Jan. 16, 2007

(54) METHOD FOR MAKING A SEMICONDUCTOR STRUCTURE USING SILICON GERMANIUM

(75) Inventors: Marius K. Orlowski, Austin, TX (US); Alexander L. Barr, Crolles (FR); Mariam G. Sadaka, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 298 days.

(21) Appl. No.: 10/836,172

(22) Filed: Apr. 30, 2004

(65) Prior Publication Data

US 2005/0245092 A1 Nov. 3, 2005

(51) Int. Cl.
*H01L 21/00* (2006.01)

(52) U.S. Cl. ........... 438/933; 438/752; 438/753; 257/E21; 257/411; 257/582; 257/648

(58) Field of Classification Search ............ 438/933, 438/311, 149, 291, 479, 517, 752, 753, 758, 438/770

See application file for complete search history.

(56) References Cited

U.S. PATENT DOCUMENTS 6,369,438 B1    4/2002  Sugiyama
6,759,712 B1*   7/2004  Bhattacharyya ............ 257/347
6,764,883 B1*   7/2004  Dokumaci et al. ........... 438/149
6,998,683 B1*   2/2006  Bhattacharyya ............ 257/351
7,042,052 B1*   5/2006  Bhattacharyya ............ 257/347
2003/0006461 A1 1/2003  Tezuka

FOREIGN PATENT DOCUMENTS

JP        2000-243946        9/2000

* cited by examiner

*Primary Examiner*—David Nhu
(74) *Attorney, Agent, or Firm*—James L. Clingan, Jr.; Joanna G. Chiu

(57) ABSTRACT

A semiconductor substrate having a silicon layer is provided. In one embodiment, the substrate is a silicon-on-insulator (SOI) substrate having an oxide layer underlying the silicon layer. An amorphous or polycrystalline silicon germanium layer is formed overlying the silicon layer. Alternatively, germanium is implanted into a top portion of the silicon layer to form an amorphous silicon germanium layer. The silicon germanium layer is then oxidized to convert the silicon germanium layer into a silicon dioxide layer and to convert at least a portion of the silicon layer into germanium-rich silicon. The silicon dioxide layer is then removed prior to forming transistors using the germanium-rich silicon. In one embodiment, the germanium-rich silicon is selectively formed using a patterned masking layer over the silicon layer and under the silicon germanium layer. Alternatively, isolation regions may be used to define local regions of the substrate in which the germanium-rich silicon is formed.

21 Claims, 5 Drawing Sheets

METHOD FOR MAKING A SEMICONDUCTOR STRUCTURE USING SILICON GERMANIUM

FIELD OF THE INVENTION

This invention relates to semiconductor devices, and more particularly, to semiconductor devices that use silicon germanium.

RELATED ART

Silicon has historically been by far the most common semiconductor material used in the manufacture of integrated circuits and the benefits of silicon are well known. More recently the benefits of silicon with germanium present are becoming more relevant and being pursued. One of the difficulties has been the ability of forming a high quality silicon germanium crystal, that is, one that is high quality monocrystalline, especially at the desired concentration of germanium. High quality silicon monocrystalline structures are readily available and much less costly than silicon germanium ones, even silicon germanium ones of low concentrations of germanium, so it has been difficult for silicon germanium to compete.

But even from the technical standpoint, it has been difficult to epitaxially grow monocrystalline silicon germanium at concentrations of germanium in excess of 10%. Thus to achieve the more desirable concentrations in the range of 30%, special post treatments have been required. One example has been to oxidize the 10% silicon germanium material, which has the effect of using up the silicon and causing the unused germanium to diffuse into the remaining portion of the silicon germanium layer and thereby increasing the germanium concentration. This is expensive because it requires the growth of a relatively thick layer of silicon germanium, which is time consuming and expensive to grow.

Thus, there is a need for a method of forming monocrystalline silicon germanium that is both high quality and cost effective.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect active semiconductor is achieved using silicon germanium by beginning with a monocrystalline silicon layer. On this silicon layer a relatively inexpensive layer of silicon germanium is formed. This layer can be formed by deposition of a layer that is polycrystalline or amorphous or by implanting germanium into the silicon layer. This relatively inexpensive silicon germanium layer is then oxidized, which has the effect of diffusing germanium into the underlying monocrystalline silicon layer. This results in the underlying monocrystalline layer being silicon germanium. The germanium concentration of the monocrystalline layer is chosen by selecting the concentration of the germanium in and the thickness of the relatively inexpensive silicon germanium layer. The result is a silicon germanium semiconductor of desired germanium thickness that can be used as the active semiconductor or on which to epitaxially grow a strained silicon layer. This is better understood by reference to the figures and the following description.

Figure 1:
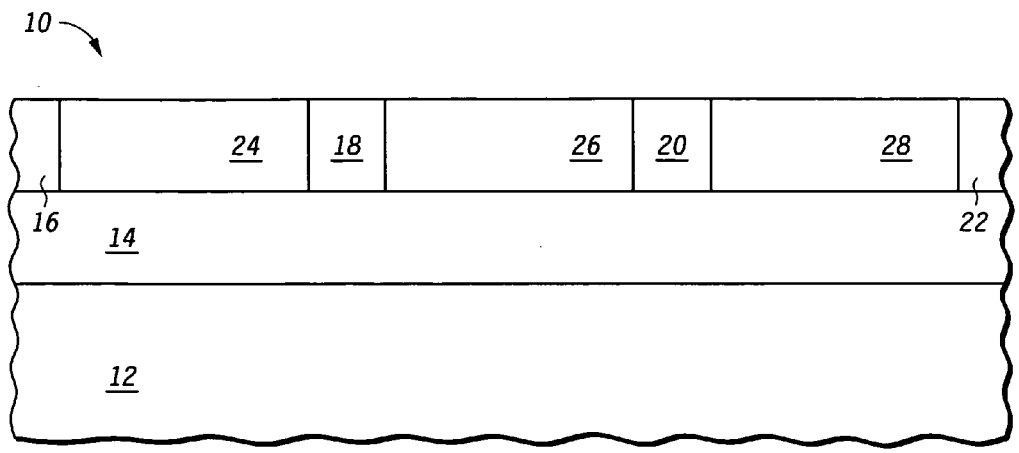
FIG. 1 is a cross section of a semiconductor structure at a first stage in processing according to a first embodiment of the invention.

Shown in FIG. 1 is a semiconductor structure 10 comprising a semiconductor layer 12 of silicon, a buried oxide 14 on semiconductor layer 12, a trench isolation region 16, a trench isolation region 18, a trench isolation region 20, a trench isolation region 22, an active region 24 between trench isolation regions 16 and 18, an active region 26 between trench isolation regions 18 and 20, and an active region 28 between trench isolation regions 20 and 22. Active regions 24–28 are monocrystalline silicon. Trench isolation regions 16–22 are an insulator such as oxide. The trench isolation regions 16–22 extend from buried oxide 14 to a surface of semiconductor structure 10 at this stage in processing. Similarly, active regions 24–28 extend from buried oxide 14 to the surface of semiconductor structure 10 as shown in FIG. 1. This structure is readily achieved using well known semiconductor on insulator (SOI) techniques.

Figure 2:
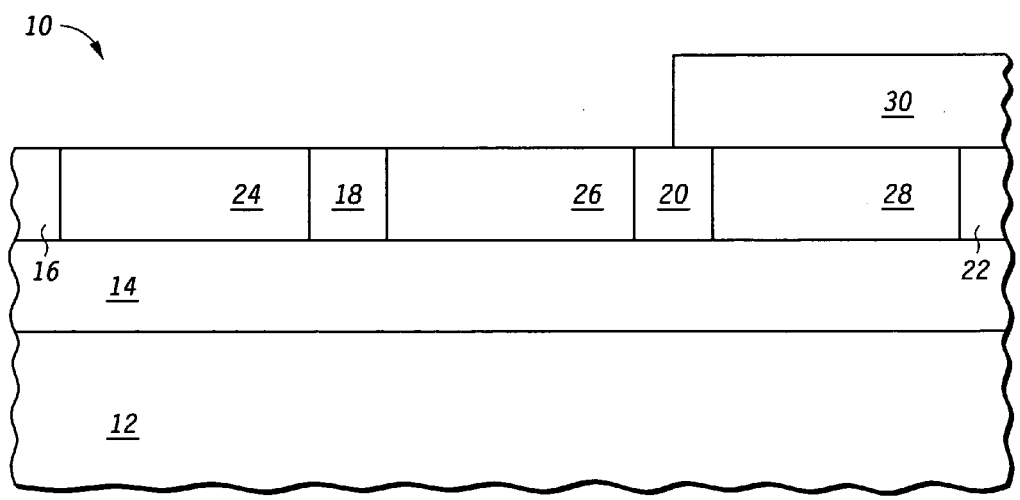
FIG. 2 is a cross section of the semiconductor structure of FIG. 1 at a subsequent stage in processing.

Shown in FIG. 2 is semiconductor structure 10 after formation of a mask 30 over all of active region 28 and extends over portions of trench isolation regions 20 and 22. Mask 30 so situated results in active regions 24 and 26 being exposed. This preferably formed of nitride but another material may also be effective. This mask does not require very much precision and is easily aligned to trench isolation regions 20 and 22. This may be formed by depositing a layer of nitride, depositing a layer of photoresist, patterning the photoresist, and then etching the nitride according to the pattern in the photoresist to leave mask 30.

Figure 3:
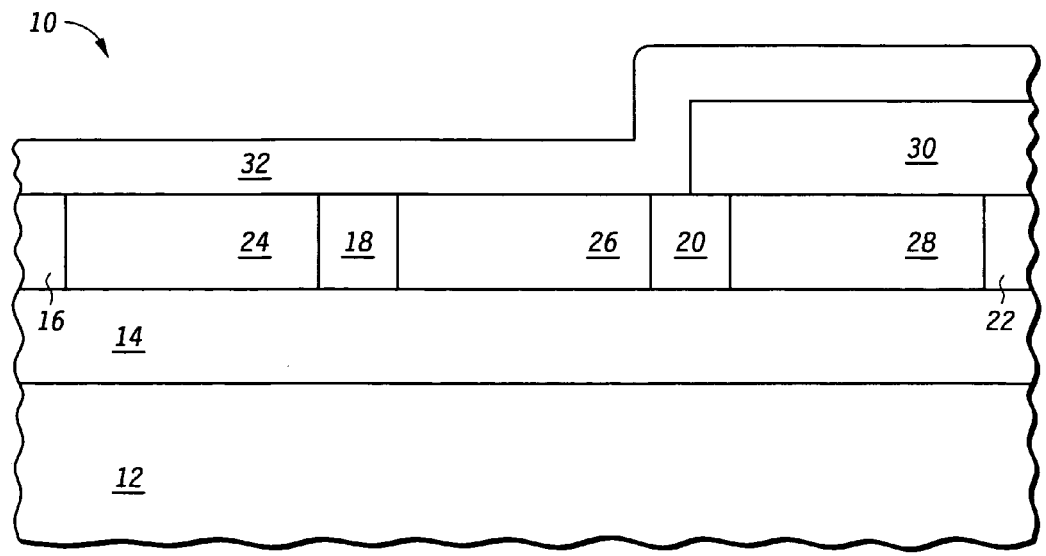
FIG. 3 is a cross section of the semiconductor structure of FIG. 2 at a subsequent stage in processing.

Shown in FIG. 3 is semiconductor structure 10 after deposition of a silicon germanium layer 32. This is blanket deposited and need not be patterned. This layer 32 may be deposited as amorphous or as polycrystalline both of which are less costly to form than to epitaxially grow monocrystalline silicon germanium. Further, trench isolation regions 16–22 are formed prior to the deposition of this silicon germanium layer 32.

Figure 4:
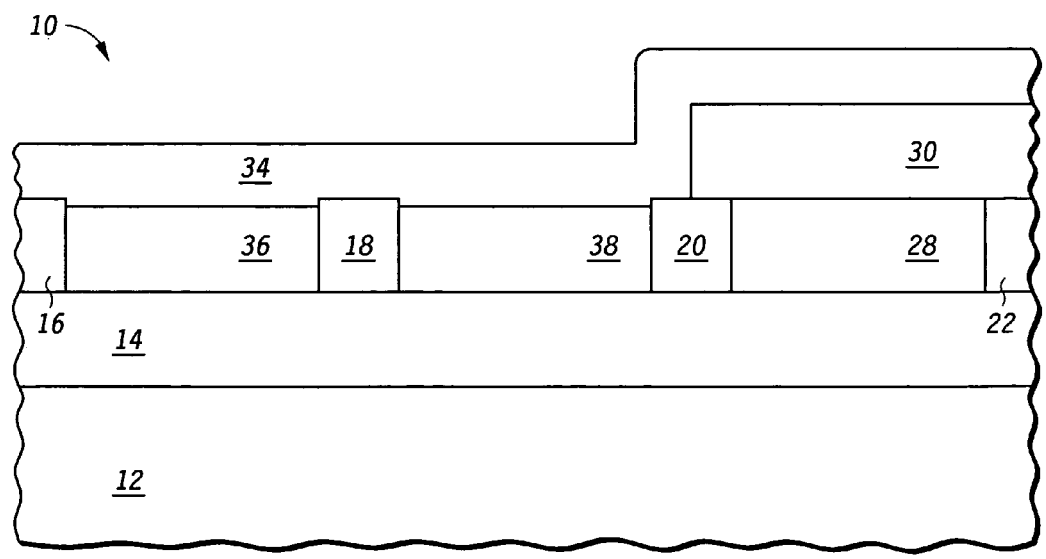
FIG. 4 is a cross section of the semiconductor structure of FIG. 3 at a subsequent stage in processing.

Shown in FIG. 4 is oxide layer 34 and active regions 36 and 38 after oxidation of silicon germanium layer 32 of FIG.

3. This oxidation step converts silicon germanium layer 32 into oxide layer 34, which is silicon-containing and removable, and causes the diffusion of germanium into active regions 24 and 26 to form active regions 36 and 38, respectively, of silicon germanium. Thus, active regions 24 and 26 are thereby converted into germanium-rich silicon regions. Active region 28 remains silicon only because of mask 30. For a thickness of active regions 24 and 26 of 700 angstroms, an effective thickness of silicon germanium layer 32 is about 500 angstroms at about 30% germanium. The resulting thickness of active regions 36 and 38 is about 500 angstroms. Under these conditions the resulting concentration of germanium in active regions 36 and 38 is about 30%. Other ratios of thickness and germanium concentrations can also be used to achieve the 30% concentration of germanium in active regions 36 and 38. Also, active regions 36 and 38 may desirably have a somewhat different concentration of germanium. The desired range of germanium concentration can even span 15–50% in active regions 36 and 38. In this example, active regions 36 and 38 are reduced in thickness from active regions 24 and 26. The amount of this reduction, which is selected by how long the oxidation step is run, must also be considered in the final calculation for the germanium concentration. The resulting concentration is the ratio of the thickness of the silicon germanium layer to the final active region thickness times the concentration of germanium in the silicon germanium layer.

Active regions 36 and 38 are somewhat compressive due to the originating silicon structure. As the germanium replaces silicon in the crystal lattice the overall crystal structure becomes increasingly compressive. The elevated temperature during the oxidation of the top portion of active regions 36 and 38 causes some relaxation. Thus there is relaxation from the original silicon structure but the crystal itself, since it includes germanium, is under compression. This relaxation is made relatively easy to achieve because active regions 24 and 26 of silicon are surrounded by the oxide of trench isolation regions 16, 18, and 20. The compression is good for P channel transistor performance.

Figure 5:
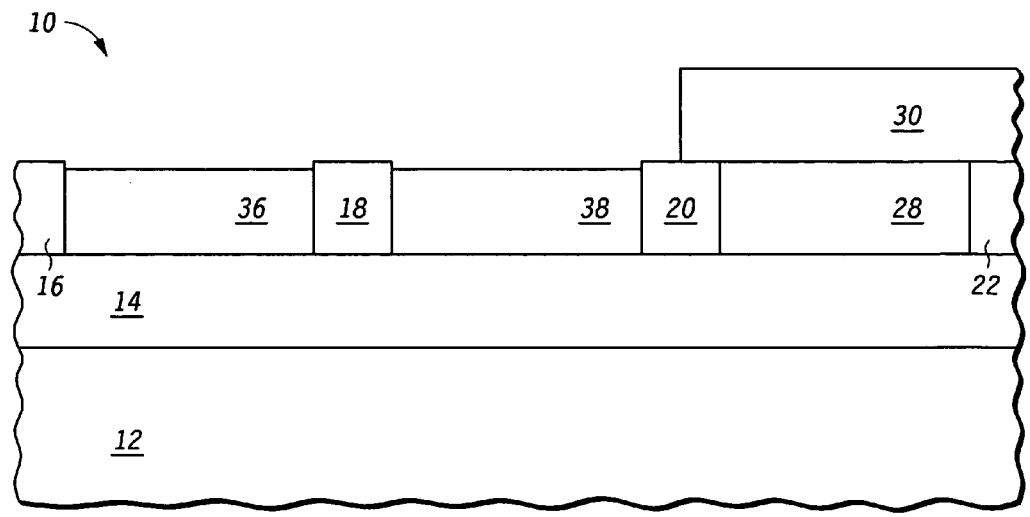
FIG. 5 is a cross section of the semiconductor structure of FIG. 4 at a subsequent stage in processing.

Shown in FIG. 5 is semiconductor structure 10 after removal of oxide layer 34. This exposes active regions 36 and 38. As an option, it may desirable at this point to form a thin oxide layer over regions 36 and 38.

Figure 6:
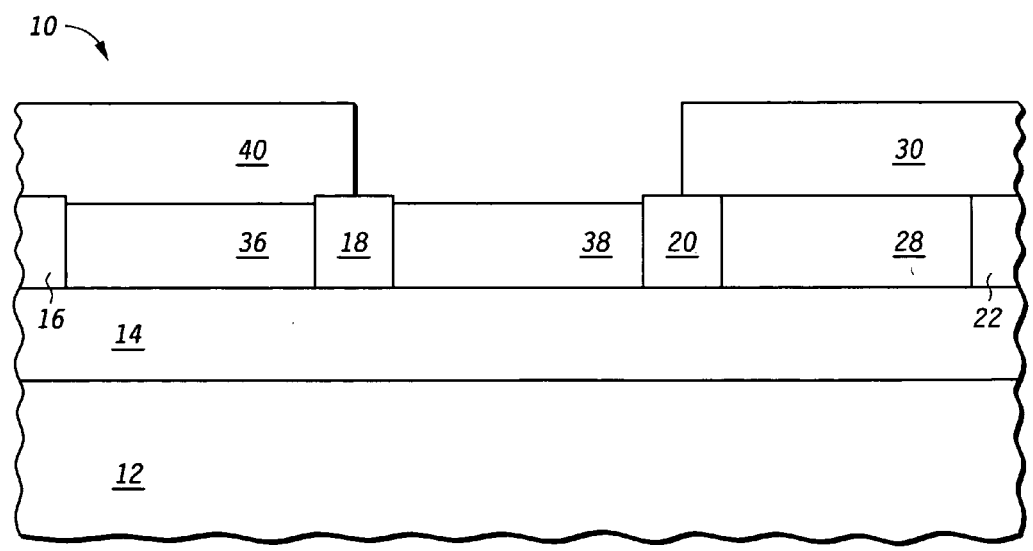
FIG. 6 is a cross section of the semiconductor structure of FIG. 5 at a subsequent stage in processing.

Shown in FIG. 6 is semiconductor structure 10 after formation of a mask 40 over active region 36. In this example mask 30 is shown as not being removed. An alternative is to remove mask 30 and reform the mask over active region 28 when mask 40 is formed. The same process used for forming mask 30 may be used for forming mask 40. The result is that active region 38 is exposed.

Figure 7:
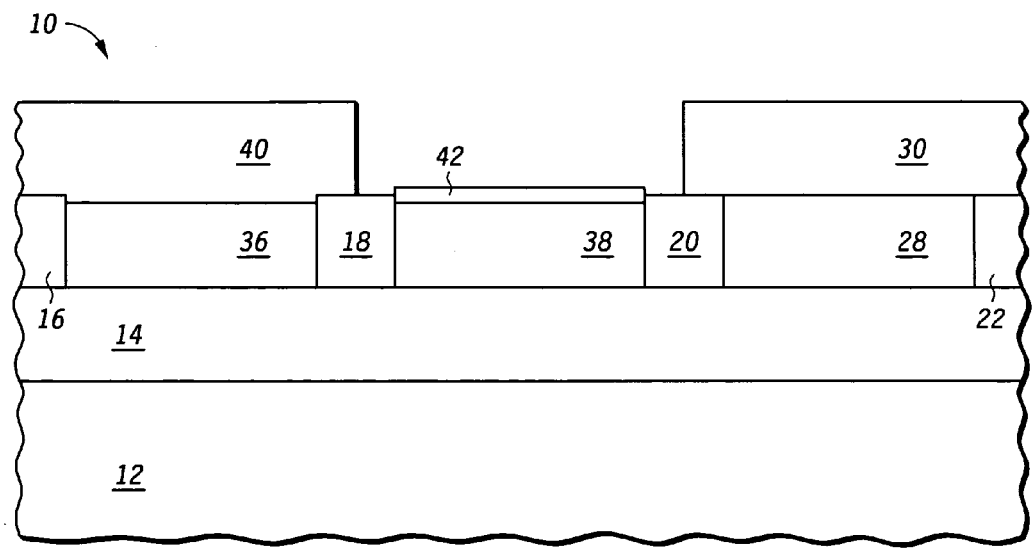
FIG. 7 is a cross section of the semiconductor structure of FIG. 6 at a subsequent stage in processing.

Shown in FIG. 7 is semiconductor structure 7 after epitaxially growing a silicon layer 42, which is monocrystalline, on active region 38. Active region 38, being at least somewhat relaxed from the original silicon structure, induces a tensile stress to silicon layer 42 and thereby cause silicon layer 42 to be strained. Silicon layer 42 being strained is desirable for N channel transistor performance. The amount of strain is about 1%. After formation of silicon layer 42, a P-type implant is performed. It may be beneficial to form thin oxide layer over active silicon layer 42 prior to performing the implant. The implant is to provide the background doping for the subsequent formation of an N channel transistor.

Figure 8:
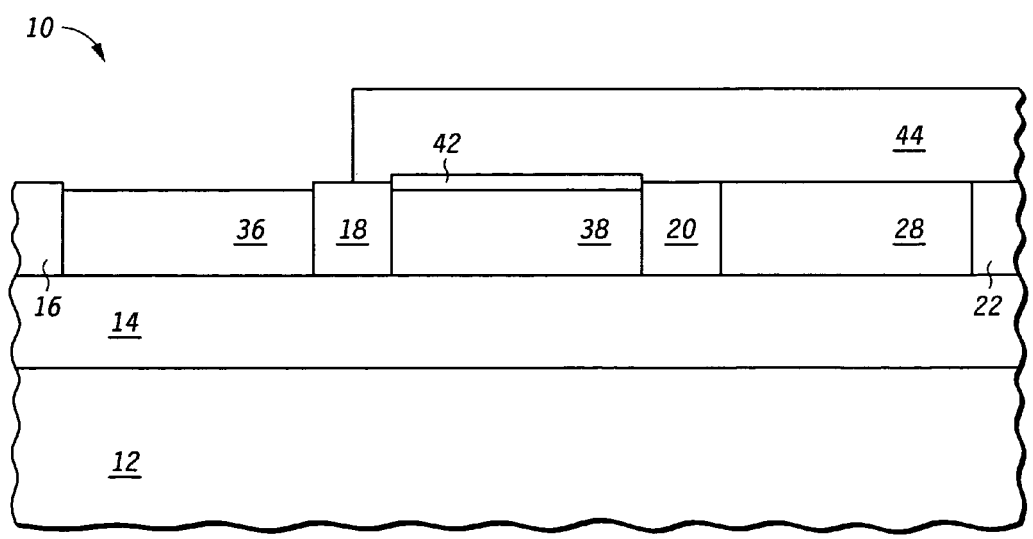
FIG. 8 is a cross section of the semiconductor structure of FIG. 7 at a subsequent stage in processing.

Shown in FIG. 8 is semiconductor structure 10 after removal of mask 40 and the formation of mask 44. Mask 44 covers active regions 38 and 28 and silicon layer 42, which is also an active region. This results in active region 36 being exposed for an implant. Mask 44 can be a wholly new mask or can be a combination of a new mask and mask 30. This mask may be formed in the same manner as for the formation of masks 30 and 40. The implant is of the N type to provide background doping for the subsequent formation of a P channel transistor. This active region is under at least some compressive stress, which is advantageous for P channel performance.

Figure 9:
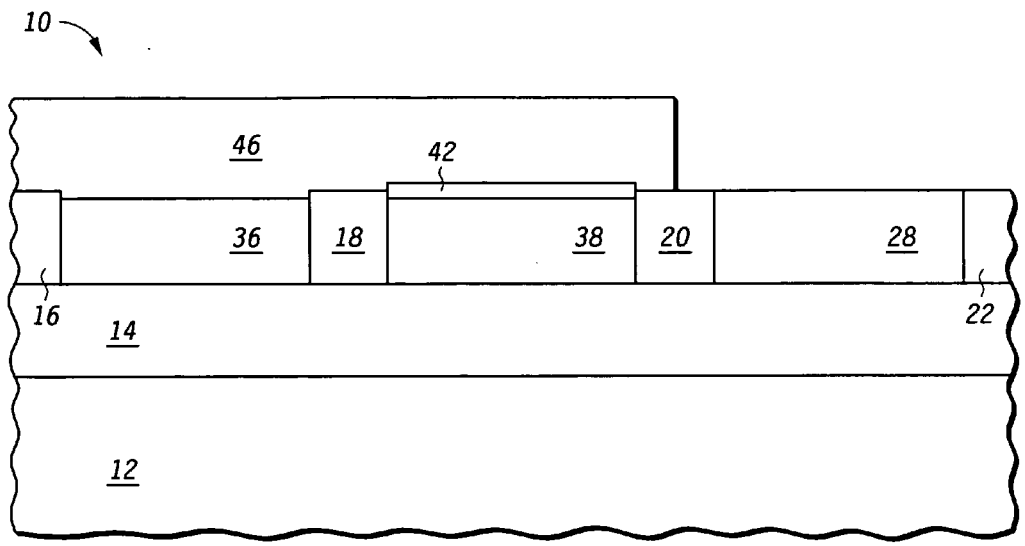
FIG. 9 is a cross section of the semiconductor structure of FIG. 8 at a subsequent stage in processing.

Shown in FIG. 9 is semiconductor structure 10 after removal of mask 44 and the formation of a mask 46 over active regions 36 and 38 and silicon layer 42. This exposes active region 28, which is conventional monocrystalline silicon. Active region 28 is thus available to make transistors of the type that have been most commonly in use. Thus, the benefits of the transistor types in common mass production are thus available in semiconductor structure 10.

Figure 10:
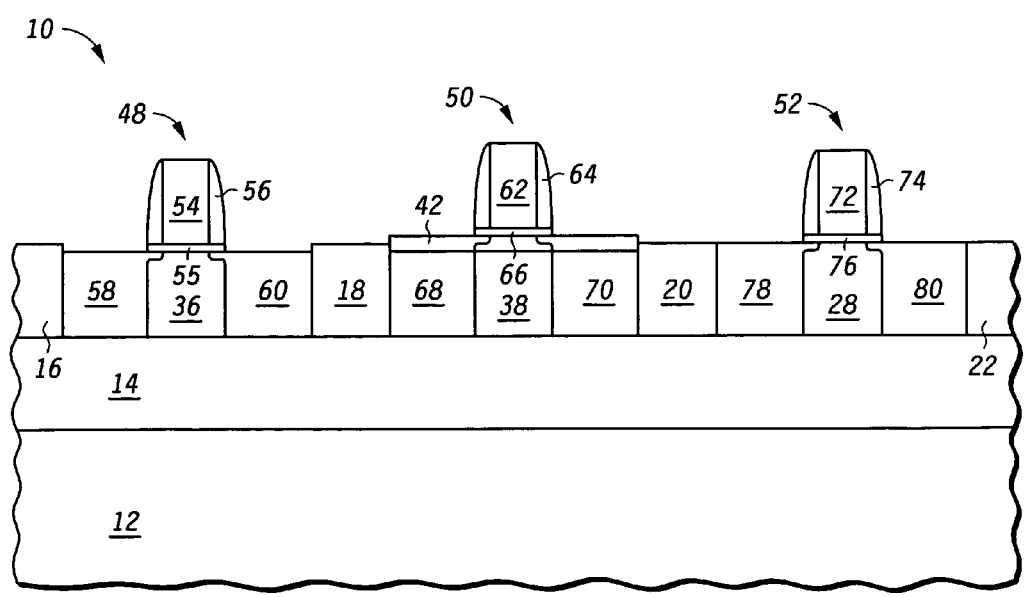
FIG. 10 is a cross section of the semiconductor structure of FIG. 9 at a subsequent stage in processing.

Shown in FIG. 10 is semiconductor structure 10 after formation of transistors 48, 50, and 52 in and on active regions 36, 38, and 28, respectively. Transistor 50 is also formed in silicon layer 42. Transistor 48, which is P channel, has a gate 54 over active region 36, a gate dielectric between active region 36 and gate 54, a first source/drain 58 in active region 36, a second source/drain 60 in active region 36 spaced from source/drain 58, and a sidewall spacer 56 around gate 54. Source/drains 58 and 60 are P type. Transistor 50, which is N channel, has a gate 62 over active region 38 and silicon layer 42, a gate dielectric 66 between gate 62 and silicon layer 42, a source/drain 68 in layer 42 and active region 68, a source/drain 70 spaced from source/drain region 68 and in active region 38 and silicon layer 42, and a sidewall spacer 64 around gate 62. Source/drains 68 and 70 are N type. Transistor 52, which can be either N channel or P channel, has a gate 72 over active region 28, a gate dielectric 76 between gate 72 and active region 28, a source/drain region 78 in active region 28, a source/drain 80 in active region 28, and a sidewall spacer 74 around gate 72. Source/drains 78 and 80 can be either P or N type. Transistor 52 demonstrates that conventional N and P channel transistors can be relatively simply integrated into this described process.

In the foregoing specification, the invention has been described with reference to specific embodiments. However, one of ordinary skill in the art appreciates that various modifications and changes can be made without departing from the scope of the present invention as set forth in the claims below. For example, semiconductor materials different from germanium and silicon may be used in this manner to achieve this result. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. As an example of a further benefit is that by being able to form the trench isolation regions before the formation of the silicon germanium active regions, there is no extra development required in the formation of these trench isolation regions as would be required for forming trench isolation in silicon germanium regions. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   providing a semiconductor substrate;
   forming a first layer over the semiconductor substrate, wherein the first layer is a layer selected from a group consisting of an amorphous silicon germanium layer and a polycrystalline silicon germanium containing layer; and
   oxidizing the first layer, wherein oxidizing the first layer converts the first layer into a silicon oxide layer and converts at least a portion of the semiconductor substrate into a germanium-rich semiconductor layer.

2. The method of claim 1, wherein the semiconductor substrate comprises a buried oxide layer underlying a semiconductor layer, and wherein during oxidation of the first layer, the semiconductor layer of the semiconductor substrate is converted into the germanium-rich semiconductor layer.

3. The method of claim 1, wherein the semiconductor substrate comprises a silicon layer and the at least a portion of the semiconductor substrate comprises the silicon layer, and wherein during oxidation of the first layer, the silicon layer of the semiconductor substrate is converted into a germanium-rich silicon layer.

4. The method of claim 1, wherein oxidizing the first layer converts the entire first layer into the silicon oxide layer.

5. The method of claim 1, further comprising removing the silicon oxide layer.

6. The method of claim 1, wherein the germanium-rich semiconductor layer has a germanium content in a range of about 15 to 50 percent.

7. The method of claim 1, wherein forming the first layer comprises blanket depositing the first layer.

8. The method of claim 1, wherein forming the first layer comprises implanting germanium into a top portion of the semiconductor substrate to convert the top portion into an amorphous silicon germanium layer.

9. The method of claim 1, wherein the semiconductor substrate comprises a first isolation region and a second isolation region, and wherein the germanium-rich silicon layer is formed between the first and the second isolation regions.

10. The method of claim 1, further comprising forming a patterned masking layer over the semiconductor substrate prior to forming the first layer, and wherein the germanium-rich silicon layer is formed in portions of the semiconductor substrate exposed by the patterned masking layer.

11. The method of claim 1, further comprising forming a transistor having a gate dielectric over the germanium-rich semiconductor layer, a gate over the gate dielectric, a channel under the gate in the germanium-rich semiconductor layer, and source/drain regions laterally spaced from the channel.

12. The method of claim 1, further comprising:
    forming a semiconductor layer over the germanium-rich semiconductor layer; and
    forming a transistor having a gate dielectric over the germanium-rich semiconductor layer, a gate over the gate dielectric, a channel under the gate in the semiconductor layer, and source/drain regions laterally spaced from the channel.

13. A method, comprising:
    providing a semiconductor substrate comprising a silicon layer;
    forming a silicon germanium layer on the silicon layer of the semiconductor substrate, wherein the silicon germanium layer is one of amorphous or polycrystalline; and
    oxidizing the silicon germanium layer to convert the silicon germanium layer to silicon dioxide and to convert at least a portion of the silicon layer to germanium-rich silicon.

14. The method of claim 13, wherein forming the silicon germanium layer comprises blanket deposition of the silicon germanium layer.

15. The method of claim 13, wherein forming the silicon germanium layer comprises implanting germanium into a top portion of the silicon layer of the semiconductor substrate.

16. The method of claim 13, further comprising, after oxidizing the silicon germanium layer, removing the converted silicon germanium layer.

17. The method of claim 13, further comprising:
    forming isolation regions in the silicon layer, wherein active portions of the silicon layer between the isolation regions are converted to germanium-rich silicon.

18. The method of claim 13, further comprising:
    prior to forming the silicon germanium layer, forming a patterned masking layer overlying the silicon layer, wherein portions of the silicon layer exposed by the patterned masking layer are converted to germanium-rich silicon.

19. The method of claim 13, further comprising forming a transistor having a gate dielectric over the germanium-rich silicon, a gate over the gate dielectric, a channel under the gate in the germanium-rich silicon, and source/drain regions laterally spaced from the channel.

20. The method of claim 13, further comprising:
    forming a semiconductor layer over the germanium-rich silicon; and
    forming a transistor having a gate dielectric over the semiconductor layer, a gate over the gate dielectric, a channel under the gate in the semiconductor layer, and source/drain regions laterally spaced from the channel.

21. The method of claim 13, wherein the semiconductor substrate further comprises a buried oxide layer underlying the silicon layer.

* * * * *